(12) United States Patent
Suzuki et al.

(10) Patent No.: US 10,741,696 B2
(45) Date of Patent: Aug. 11, 2020

(54) SEMICONDUCTOR DEVICE AND METHOD FOR MANUFACTURING SAME

(71) Applicant: Sharp Kabushiki Kaisha, Sakai, Osaka (JP)

(72) Inventors: Masahiko Suzuki, Sakai (JP); Hajime Imai, Sakai (JP); Hideki Kitagawa, Sakai (JP); Tetsuo Kikuchi, Sakai (JP); Setsuji Nishimiya, Sakai (JP); Teruyuki Ueda, Sakai (JP); Kengo Hara, Sakai (JP); Tohru Daitoh, Sakai (JP); Toshikatsu Itoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/336,481

(22) PCT Filed: Sep. 21, 2017

(86) PCT No.: PCT/JP2017/034071
§ 371 (c)(1),
(2) Date: Mar. 26, 2019

(87) PCT Pub. No.: WO2018/061969
PCT Pub. Date: Apr. 5, 2018

(65) Prior Publication Data
US 2019/0326443 A1 Oct. 24, 2019

(30) Foreign Application Priority Data
Sep. 27, 2016 (JP) .................................. 2016-188067

(51) Int. Cl.
*H01L 29/786* (2006.01)
*G02F 1/1343* (2006.01)
(Continued)

(52) U.S. Cl.
CPC ...... *H01L 29/78693* (2013.01); *G02F 1/1368* (2013.01); *G02F 1/13454* (2013.01);
(Continued)

(58) Field of Classification Search
CPC ......... H01L 29/78693; H01L 21/02565; H01L 29/247; H01L 27/124; H01L 29/66969;
(Continued)

(56) References Cited

U.S. PATENT DOCUMENTS 8,203,143 B2 * 6/2012 Imai .................. H01L 29/78696
257/43
9,627,418 B2 * 4/2017 Yamazaki ......... H01L 29/78696
(Continued)

FOREIGN PATENT DOCUMENTS

JP 2010-028021 A 2/2010
JP 2011-129926 A 6/2011
(Continued)

OTHER PUBLICATIONS

Official Communication issued in International Patent Application No. PCT/JP2017/034071, dated Nov. 14, 2017.

*Primary Examiner* — William Coleman
(74) *Attorney, Agent, or Firm* — Keating & Bennett, LLP

(57) ABSTRACT

A semiconductor device includes a thin film transistor including a semiconductor layer, a gate electrode, a gate insulating layer, a source electrode, a drain electrode, the semiconductor layer includes a layered structure including a first oxide semiconductor layer including In and Zn, in which an atomic ratio of In with respect to all metallic elements included in the first oxide semiconductor layer is higher than an atomic ratio of Zn, a second oxide semiconductor layer including In and Zn, in which an atomic ratio of Zn with respect to all metallic elements included in the second oxide semiconductor layer is higher than an atomic
(Continued)

ratio of In, and an intermediate oxide semiconductor layer arranged between the first oxide semiconductor layer and the second oxide semiconductor layer, and the first and second oxide semiconductor layers are crystalline oxide semiconductor layers, and the intermediate oxide semiconductor layer is an amorphous oxide semiconductor layer, and the first oxide semiconductor layer is arranged nearer to the gate insulating layer than the second oxide semiconductor layer.

13 Claims, 9 Drawing Sheets

(51) Int. Cl.
| | | |
|---|---|---|
| *G02F 1/1345* | (2006.01) | |
| *G02F 1/1368* | (2006.01) | |
| *H01L 21/02* | (2006.01) | |
| *H01L 27/12* | (2006.01) | |
| *H01L 29/24* | (2006.01) | |
| *H01L 29/66* | (2006.01) | |
| *G02F 1/1362* | (2006.01) | |

(52) U.S. Cl.
CPC .. *G02F 1/134363* (2013.01); *H01L 21/02565* (2013.01); *H01L 21/02592* (2013.01); *H01L 21/02631* (2013.01); *H01L 27/124* (2013.01); *H01L 27/1225* (2013.01); *H01L 27/1251* (2013.01); *H01L 29/247* (2013.01); *H01L 29/66969* (2013.01); *H01L 29/78675* (2013.01); *H01L 29/78696* (2013.01); *G02F 1/136227* (2013.01); *G02F 2001/13685* (2013.01); *G02F 2001/134372* (2013.01); *G02F 2202/104* (2013.01)

(58) Field of Classification Search
CPC ........... H01L 27/1251; G02F 1/134363; G02F 1/1368; C23C 14/08
See application file for complete search history.

(56) References Cited

U.S. PATENT DOCUMENTS

| | | | |
|---|---|---|---|
| 9,660,102 B2 * | 5/2017 | Godo | H01L 29/78693 |
| 9,666,721 B2 * | 5/2017 | Yamazaki | H01L 29/66742 |
| 9,831,274 B2 * | 11/2017 | Takahashi | H01L 27/1225 |
| 10,134,914 B2 * | 11/2018 | Yamazaki | H01L 29/78648 |
| 10,158,026 B2 * | 12/2018 | Yamazaki | H01L 29/7831 |
| 2011/0121284 A1 | 5/2011 | Yamazaki et al. | |
| 2011/0127522 A1 | 6/2011 | Yamazaki | |
| 2011/0140095 A1 | 6/2011 | Kim et al. | |
| 2012/0138922 A1 | 6/2012 | Yamazaki et al. | |
| 2013/0009219 A1 | 1/2013 | Yamazaki et al. | |
| 2013/0092925 A1 | 4/2013 | Saito et al. | |
| 2013/0320334 A1 | 12/2013 | Yamazaki et al. | |
| 2014/0021467 A1 | 1/2014 | Koezuka et al. | |
| 2014/0131696 A1 | 5/2014 | Ono et al. | |
| 2014/0175433 A1 | 6/2014 | Yamazaki et al. | |
| 2014/0225105 A1 * | 8/2014 | Tanaka | H01L 29/7869 257/43 |
| 2014/0231798 A1 | 8/2014 | Ono et al. | |
| 2014/0286076 A1 | 9/2014 | Aoki et al. | |
| 2015/0214383 A1 | 7/2015 | Godo et al. | |

FOREIGN PATENT DOCUMENTS

| | | |
|---|---|---|
| JP | 2012-134475 A | 7/2012 |
| JP | 5052693 B1 | 10/2012 |
| JP | 2013-030682 A | 2/2013 |
| JP | 2013-038399 A | 2/2013 |
| JP | 2013-041945 A | 2/2013 |
| JP | 2013-102149 A | 5/2013 |
| JP | 2013-179296 A | 9/2013 |
| JP | 2014-007399 A | 1/2014 |
| JP | 2014-039019 A | 2/2014 |
| JP | 2014-142619 A | 8/2014 |
| JP | 2014-179596 A | 9/2014 |
| JP | 2014-209727 A | 11/2014 |
| JP | 2015-062248 A | 4/2015 |
| JP | 2015-097275 A | 5/2015 |
| JP | 2015-167242 A | 9/2015 |

* cited by examiner

SEMICONDUCTOR DEVICE AND METHOD FOR MANUFACTURING SAME

TECHNICAL FIELD

The disclosure relates to a semiconductor device formed using an oxide semiconductor.

BACKGROUND ART

An active matrix substrate used for a liquid crystal display device and the like includes a switching element, such as a thin film transistor (hereinafter referred to as "TFT"), for every pixel. As this switching element, in the related art, a TFT in which an amorphous silicon film is provided as an active layer (hereinafter, "amorphous silicon TFT") or a TFT in which a polycrystalline silicon film is provided as an active layer (hereinafter, "polycrystalline silicon TFT") have been widely used.

In recent years, in some cases, oxide semiconductors have been used as a material of an active layer of the TFT, in place of the amorphous silicon or polycrystalline silicon. This TFT is referred to as an "oxide semiconductor TFT". The oxide semiconductor has a higher mobility than the amorphous silicon. Thus, the oxide semiconductor TFT can operate at a higher speed than the amorphous silicon TFT. The use of a TFT in which an oxide semiconductor layer is provided as an active layer (hereinafter referred to as "oxide semiconductor TFT") has been known. The oxide semiconductor has a higher mobility than the amorphous silicon. Thus, the oxide semiconductor TFT can operate at a higher speed than the amorphous silicon TFT.

Meanwhile, a technology in which a driving circuit such as a gate driver and a source driver is monolithically (integrally) provided on a substrate has been known. Recently, a technology in which such a driving circuit (monolithic driver) is produced using the oxide semiconductor TFT has been utilized.

As for the oxide semiconductor TFT, there has been proposed a laminated semiconductor layer in which two oxide semiconductor layers of different compositions are laminated is used as an active layer. The TFT structure like this is referred to as a "two-layer channel structure", and a TFT having the two-layer channel structure is referred to as a "two-layer channel structure TFT". For example, PLT1 indicates that a laminated semiconductor layer including two amorphous In—Ga—Zn—O based semiconductors of different compositions is used as an active layer of the oxide semiconductor layer TFT.

Meanwhile, as the oxide semiconductor, for example, an amorphous or crystalline In—Ga—Zn—O based semiconductor is used. The crystalline In—Ga—Zn—O based semiconductor can have a higher mobility than the amorphous In—Ga—Zn—O based semiconductor. For example, the crystalline In—Ga—Zn—O based semiconductor is disclosed in PLT 2 or the like.

CITATION LIST

Patent Literature

PTL 1: JP 2013-041945 A
PTL 2: JP2014-007399 A

SUMMARY

Technical Problem

The inventors have conducted various studies regarding the structure of the oxide semiconductor TFT having high mobility. In these processes, when characteristics of the two-layer channel structure TFT were studied using the crystalline oxide semiconductor, it was found that characteristics such as threshold values vary among the TFTs. In addition, it was found that, in some cases, some of the TFTs leads to a normally-on type (leads to depletion) in which a threshold voltage shifts in a negative direction, and in which a drain current flows without applying a gate voltage. Thus, it was difficult to obtain a two-layer channel structure TFT having a desired characteristic and a high degree of reliability. The detailed results of studies conducted by the inventors will be described later.

An embodiment of the disclosure has been made in view of the aforementioned circumstances, and it is an object of the disclosure to provide a semiconductor device including an oxide semiconductor TFT having a stable characteristic and a high degree of reliability.

Solution to Problem

A semiconductor device of the first embodiment of the disclosure includes a substrate and a thin film transistor supported on the substrate, and the thin film transistor includes a semiconductor layer, a gate electrode, a gate insulating layer formed between the gate electrode and the semiconductor layer, and a source electrode and a drain electrode being in contact with the semiconductor layer, the semiconductor layer includes a layered structure including a first oxide semiconductor layer including In and Zn, in which an atomic ratio of In with respect to all metallic elements included in the first oxide semiconductor layer is higher than an atomic ratio of Zn, a second oxide semiconductor layer including In and Zn, in which an atomic ratio of Zn with respect to all metallic elements included in the second oxide semiconductor layer is higher than an atomic ratio of In, and an intermediate oxide semiconductor layer arranged between the first oxide semiconductor layer and the second oxide semiconductor layer, the first and second oxide semiconductor layers are crystalline oxide semiconductor layers, the intermediate oxide semiconductor layer is an amorphous oxide semiconductor layer, and the first oxide semiconductor layer is arranged nearer to the gate insulating layer than the second oxide semiconductor layer.

A semiconductor device of another embodiment of the disclosure includes a substrate and a thin film transistor supported on the substrate, and the thin film transistor includes a semiconductor layer, a gate electrode, a gate insulating layer formed between the gate electrode and the semiconductor layer, and a source electrode and a drain electrode being in contact with the semiconductor layer, the semiconductor layer includes a layered structure including a first oxide semiconductor layer including In and Zn, in which an atomic ratio of In with respect to all metallic elements included in the first oxide semiconductor layer is higher than an atomic ratio of Zn, a second oxide semiconductor layer including In and Zn, in which an atomic ratio of Zn with respect to all metallic elements included in the second oxide semiconductor layer is higher than an atomic ratio of In, and an intermediate oxide semiconductor layer arranged between the first oxide semiconductor layer and the second oxide semiconductor layer, the intermediate oxide semiconductor layer including In and Zn in which an atomic ratio of Zn and an atomic ratio of In with respect to all metallic elements included in the intermediate oxide semiconductor layer are approximately identical to each other, and the first oxide semiconductor layer is arranged nearer to a side of the gate insulating layer than the second oxide semiconductor layer.

In another embodiment, the first and second oxide semiconductor layers are crystalline oxide semiconductor layers.

In another embodiment, the intermediate oxide semiconductor layer is an amorphous oxide semiconductor layer.

In another embodiment, the intermediate oxide semiconductor layer includes a crystallite, the crystal size of which is smaller than those of the first oxide semiconductor layer and the second oxide semiconductor layer.

In another embodiment, the intermediate oxide semiconductor layer includes In and Zn, and an atomic ratio of Zn and an atomic ratio of In with respect to all metallic elements included in the intermediate oxide semiconductor layer are approximately identical to each other.

In another embodiment, the intermediate oxide semiconductor layer is in contact with the first oxide semiconductor layer and the second oxide semiconductor layer.

In another embodiment, the intermediate oxide semiconductor layer includes In, Ga, and Zn.

In another embodiment, the first oxide semiconductor layer and the second oxide semiconductor layer include In, Ga, and Zn.

In another embodiment, the first oxide semiconductor layer includes In, Sn, and Zn, and the second oxide semiconductor layer includes In, Ga, and Zn.

In another embodiment, a thickness of the first oxide semiconductor layer is smaller than a thickness of the second oxide semiconductor layer.

In another embodiment, an energy gap G1 of the first oxide semiconductor layer, an energy gap G2 of the second oxide semiconductor layer, and an energy gap Gm of the intermediate oxide semiconductor layer satisfy G2>Gm>G1.

In another embodiment, the thin film transistor includes bottom gate structure, and the first oxide semiconductor layer is in contact with an upper face of the gate insulating layer.

In another embodiment, the thin film transistor includes channel etched structure.

A manufacturing method for a semiconductor device of an embodiment of the disclosure includes (A) forming a gate electrode and a gate insulating layer covering the gate electrode on a substrate, (B) forming an oxide semiconductor layered film by forming a first oxide semiconductor film including In and Zn, an intermediate oxide semiconductor film, and a second oxide semiconductor film including In and Zn in this order, the first oxide semiconductor film and the second oxide semiconductor film being crystalline oxide semiconductor films, the intermediate oxide semiconductor film being an amorphous oxide semiconductor film, an atomic ratio of In with respect to all metallic elements included in the first oxide semiconductor film being higher than an atomic ratio of Zn, and an atomic ratio of Zn with respect to all metallic elements included in the second oxide semiconductor film being higher than an atomic ratio of In, (C) performing heat treatment with respect to the oxide semiconductor layered film at a temperature of 300 degrees Celsius or higher and 500 degrees Celsius or less, the amorphous oxide semiconductor film being maintained in an amorphous state, (D) forming a semiconductor layer including a first oxide semiconductor layer, an intermediate oxide semiconductor layer, a second oxide semiconductor layer in this order on the gate insulating later by patterning the oxide semiconductor layered film after the (C), the first oxide semiconductor film and the second oxide semiconductor film being crystalline oxide semiconductor films, and the intermediate oxide semiconductor layer being an amorphous oxide semiconductor film, and (E) forming a source electrode and a drain electrode being in contact with the semiconductor layer, thereby acquiring a thin film transistor.

In another embodiment, any of the first oxide semiconductor film, the second oxide semiconductor film, and the intermediate oxide semiconductor film includes an In—Ga—Zn—O based semiconductor.

Advantageous Effects of Disclosure

According to an embodiment of the disclosure, a semiconductor device including an oxide semiconductor TFT having a stable characteristic and a high degree of reliability can be provided.

DESCRIPTION OF EMBODIMENTS

Hereinafter, findings based on the studies of the inventors will be described.

As described above, the inventors studied the characteristics of a two-layer channel structure TFT using a crystalline oxide semiconductor.

Figure 9A:
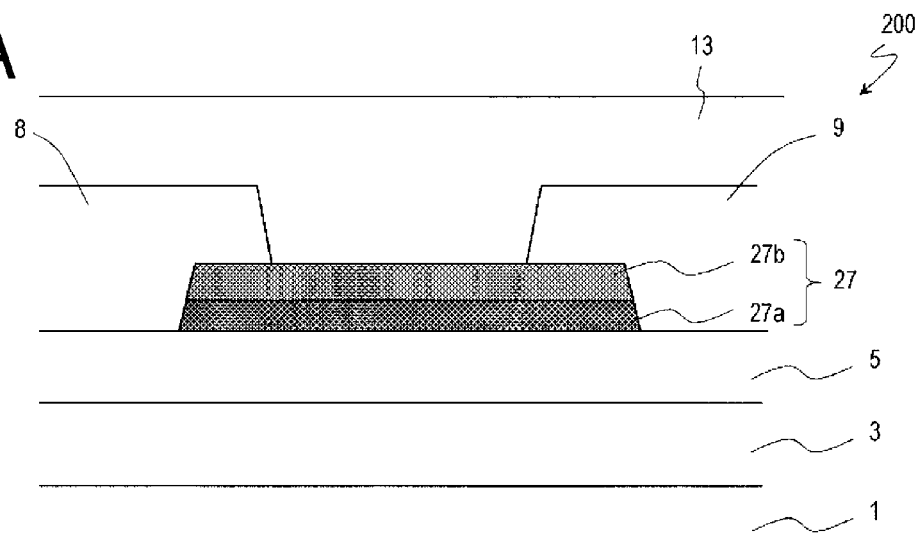
FIG. 9A is a cross-sectional view illustrating a TFT 200 of a reference example that has a two-layer channel structure using a crystalline oxide semiconductor.

FIG. 9A is a cross-sectional view illustrating a TFT 200 of a reference example that has a two-layer channel structure using the crystalline oxide semiconductor.

The TFT 200 of the reference example includes a gate electrode (or a gate wiring line) 3 supported by a substrate 1, a gate insulating layer 5 for covering the gate electrode 3, a laminated semiconductor layer 27 arranged on the gate insulating layer 5, a source electrode 8, and a drain electrode 9. The source electrode 8 and the drain electrode 9 are arranged with an interval therebetween on the laminated semiconductor layer 27. In the TFT 200, a channel is formed at a portion positioned between the source electrode 8 and the drain electrode 9 in the laminated semiconductor layer 27.

The laminated semiconductor layer 27 includes a lower layer 27a and an upper layer 27b formed on the lower layer 27a. The laminated semiconductor layer 27 is formed such that, for example, after a layered film (hereinafter, an "oxide semiconductor layered film") of a crystalline oxide semiconductor film that serves as the lower layer 27a and a crystalline oxide semiconductor film that serves as the upper layer 27b is formed on the substrate 1, the layered film is patterned using a phosphoric acetic and nitric acid based etching solution.

As a result of studies by the inventors, it was found that a threshold voltage easily shifts to a negative direction in the TFT 200 of the reference example. In addition, it was found that when a plurality of TFTs 200 are formed on the same substrate, characteristics such as a threshold value vary among the TFTs.

It is conceivable that a factor causing a problem like this is the reduction in processability of the laminated semiconductor layer, which is attributed to the mismatch of crystal lattices on the interface of the two layers 27a and 27b formed of the crystalline oxide semiconductor film. Hereinafter, using as an example the laminated semiconductor layer formed of two crystalline In—Ga—Zn—O based semiconductor layers of different compositions, a relation of the processability of the laminated semiconductor layer and a TFT characteristic will be described.

First, the laminated semiconductor layer 27 for analysis was formed on the substrate 1, and a cross section thereof was observed. Herein, as the lower layer 27a, a crystalline In—Ga—Zn—O based semiconductor layer in which In:Ga:Zn is 5:1:4 (thickness: 10 nm) was used. As the upper layer 27b, for example, a crystalline In—Ga—Zn—O based semiconductor layer in which In:Ga:Zn is 1:3:6 (thickness: 50 nm) was used.

Figure 9B:
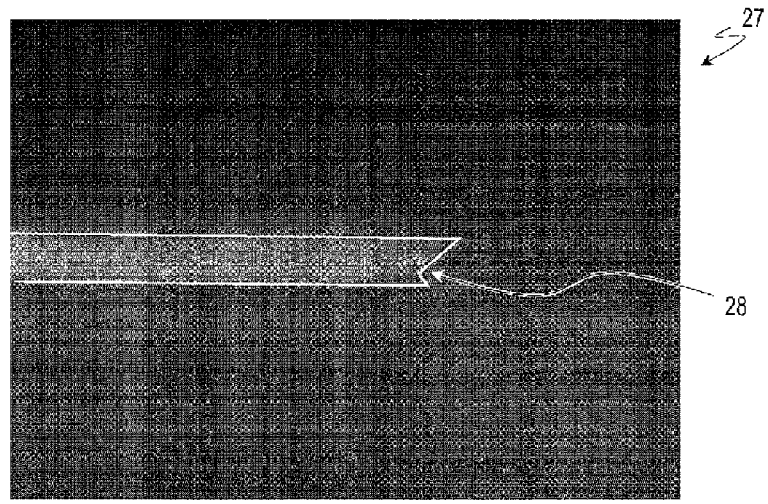
FIG. 9B is a diagram illustrating an SEM image of a laminated semiconductor layer 27 in the TFT 200 of the reference example.

FIG. 9B is a diagram exemplifying an SEM image of the laminated semiconductor layer 27 after patterning. For easier recognition, the outline of the laminated semiconductor layer 27 is represented by a white line.

Figure 9C:
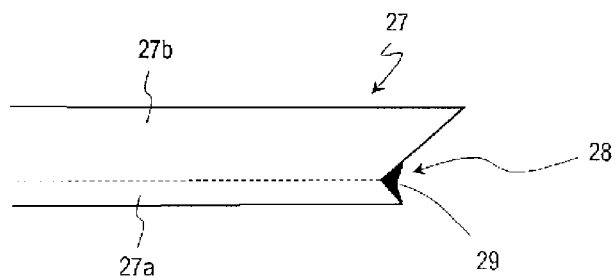
FIG. 9C is a schematic cross-sectional view to describe a film residue on a side face of the laminated semiconductor layer 27.

As seen in FIGS. 9B and 9C, a constricted part (recess) 28 is produced on the interface between the lower layer 27a and the upper layer 27b on the side face of the laminated semiconductor layer 27. This constricted part 28 may be produced also in a laminated semiconductor layer formed of crystalline oxide semiconductor layers having different compositions from those of the above, but cannot be found in a laminated semiconductor layer formed of an amorphous oxide semiconductor layer. Consequently, it is assumed that the production of the constricted part 28 is attributed to the occurrence of deviation (mismatch) of the crystal lattices due to the shift of a lattice constant on the interface between the lower layer 27a and the upper layer 27b of the crystalline In—Ga—ZnO based semiconductor layer. That is, an etching rate in the lateral direction (the horizontal direction of the substrate 1) is higher, due to the inconsistency of the lattices at or near the interface between the lower layer 27a and the upper layer 27b, than that in the interior of the lower layer 27a and the upper layer 27b. It is conceivable that the constricted part 28 was produced at or near the interface as a result of etching progressed at a high rate in the lateral direction at or near the interface.

When a TFT is formed using the laminated semiconductor layer 27 like this, the following problem may occur. After the formation of the laminated semiconductor layer 27, a source conductive film is formed to cover the laminated semiconductor layer 27, and the source conductive film is etched, whereby source and drain electrodes are formed. This process is referred to as a "source/drain separation process". At this time, as schematically illustrated in FIG. 9C, there is a possibility that part (hereinafter, a "residual portion") 29 of the source conductive film remains (film residue) in the interior of the constricted part 28. As a result, in some cases, the source electrode and the drain electrode are electrically connected by the residual portion 29 remaining in the constricted part 28, and this causes a minus shift of a threshold voltage of the TFT (leads to depletion). This may become a factor causing variations in threshold voltage among the TFTs. Further, in the source/drain separation process, the lower layer 27a having a high mobility is not sufficiently protected by the upper layer 27b, and thus the lower layer 27a might suffer process damage. Thus, there is a possibility that an oxygen deficiency occurs in the lower layer 27a, which causes a low resistance and leads to depletion.

The inventors studied in detail the structure capable of increasing the processability of the laminated semiconductor layer using the crystalline oxide semiconductor layer on the basis of the aforementioned findings. As a result, it was found that the laminated semiconductor layer having excellent processability can be obtained by inserting an intermediate oxide semiconductor layer, such as an amorphous oxide semiconductor layer, between two crystalline oxide semiconductor layers. In the present specification, a structure in which two crystalline oxide semiconductor layers are stacked with the intermediate oxide semiconductor layer sandwiched therebetween is referred to as a "three-layer channel structure", and a TFT having the three-layer channel structure is referred to as a "three-layer channel structure TFT".

In a first embodiment of the disclosure, in the three-layer channel structure TFT, after the oxide semiconductor layered film including an amorphous oxide semiconductor film is formed between two crystalline oxide semiconductor films, a laminated semiconductor layer is formed by patterning the oxide semiconductor layered film. The interface between the two crystalline oxide semiconductor films is improved by the amorphous oxide semiconductor film, whereby the constricted part is prevented from being produced on the side face of the laminated semiconductor layer during the patterning of the oxide semiconductor layered film. That is, the side face of the laminated semiconductor layer formed by the patterning can have a tapered shape (forwardly tapered shape). Thus, in the subsequent source/drain separation process, the residual portion of the source conductive film can be prevented from being left on the side face of the laminated semiconductor layer. In addition, the lower layer of the crystalline oxide semiconductor layer can be prevented from being subjected to low resistance due to process damage. Consequently, it is possible to stably achieve a desired TFT characteristic.

First Embodiment

Hereinafter, a first embodiment of a semiconductor device will be described with reference to drawings. The semiconductor device of the present embodiment may include an oxide semiconductor TFT and widely includes a circuit substrate, such as an active matrix substrate, various display devices, electronic devices, and the like.

Figure 1:
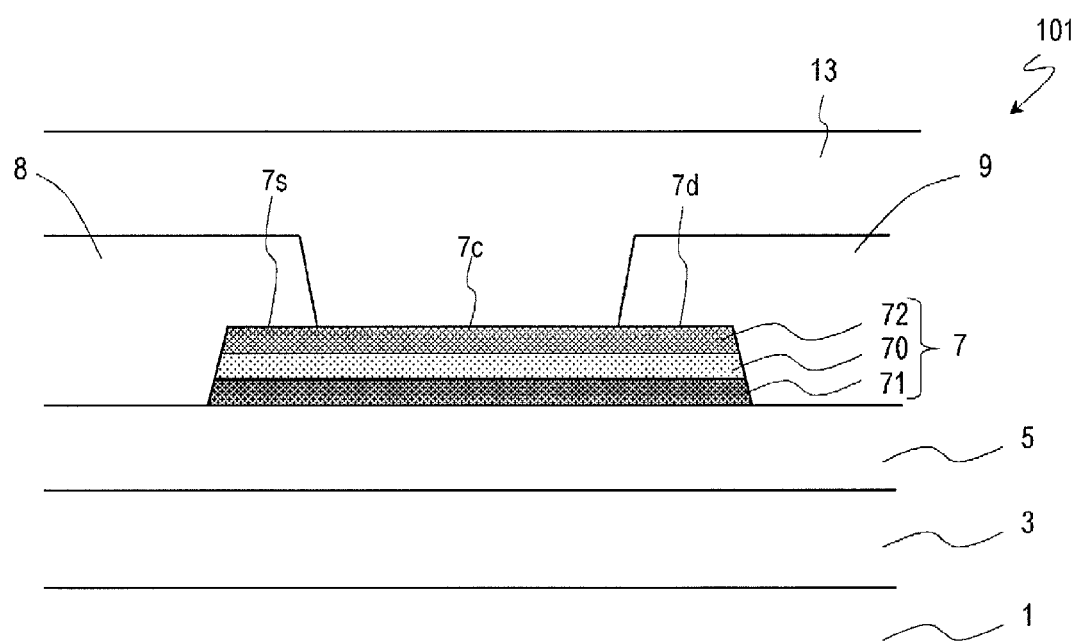
FIG. 1 is a schematic cross-sectional view of a TFT 101 of a semiconductor device of a first embodiment.

FIG. 1 is a schematic cross-sectional view illustrating one example of an oxide semiconductor TFT 101 of the semiconductor device of the present embodiment.

The semiconductor device of the present embodiment includes a substrate 1 and the oxide semiconductor TFT (hereinafter simply referred to as "TFT") 101.

The TFT 101 includes the gate electrode 3 supported on the substrate 1, a semiconductor layer 7, a gate insulating layer 5 arranged between the gate electrode 3 and the semiconductor layer 7, a source electrode 8 and a drain electrode 9 that are electrically connected to the semiconductor layer 7.

In this example, the TFT 101 is a channel etch-type TFT having a bottom gate structure, for example. The gate electrode 3 is arranged on the substrate 1 side of the semiconductor layer 7. The gate insulating layer 5 covers the gate electrode 3, and the semiconductor layer 7 is arranged to superimpose the gate electrode 3 with the gate insulating layer 5 interposed therebetween. In addition, the source electrode 8 and the drain electrode 9 are respectively arranged to be in contact with the upper face of the semiconductor layer 7.

The semiconductor layer 7 of the present embodiment has the layered structure including a first oxide semiconductor layer 71, a second oxide semiconductor layer 72, and an intermediate oxide semiconductor layer 70 arranged between the first oxide semiconductor layer 71 and the second oxide semiconductor layer 72. The first oxide semiconductor layer 71 is positioned nearer to the gate insulating layer 5 than the second oxide semiconductor layer 72. In this example, the semiconductor layer 7 has three-layer structure in which the first oxide semiconductor layer 71, the intermediate oxide semiconductor layer 70, and the second oxide semiconductor layer 72 are superimposed in this order from the gate insulating layer 5 side. Note that the semiconductor layer 7 of the present embodiment may further include a layer except for the aforementioned three layers.

The first oxide semiconductor layer 71 and the second oxide semiconductor layer 72 are, for example, crystalline oxide semiconductor layers, and the intermediate oxide semiconductor layer 70 is, for example, an amorphous oxide semiconductor layer. Herein, the "crystalline oxide semiconductor layer" is only required to be an oxide semiconductor layer that mainly includes an oxide semiconductor in a crystalline state, and may include an infinitesimal amorphous portion. The "amorphous oxide semiconductor layer" is only required to be an oxide semiconductor layer that mainly includes an oxide semiconductor in an amorphous state, and may include an infinitesimal crystalline portion, for example, a crystallite, the particle size of which is 1 nm or more and 20 nm or less. For example, an amorphous oxide semiconductor layer used as the intermediate oxide semiconductor layer may include a crystallite, the crystal size of which is smaller than those of the first oxide semiconductor layer 71 and the second oxide semiconductor layer 72.

The first oxide semiconductor layer 71 and the second oxide semiconductor layer 72 include at least In and Zn. An atomic ratio of In to all the metallic elements included in the first oxide semiconductor layer 71 is greater than an atomic ratio of Zn. In addition, an atomic ratio of Zn to all the metallic elements included in the second oxide semiconductor layer 72 is greater than an atomic ratio of In. This allows the first oxide semiconductor layer 71 to have a higher mobility than the second oxide semiconductor layer 72 and functions as a channel layer. The second oxide semiconductor layer 72 has a higher crystallinity than the first oxide semiconductor layer 71 and excels in etching tolerability and barrier properties. Thus, for example, in the source/drain separation process and the like, the second oxide semiconductor layer 72 can function as a protection layer and a sacrifice layer of the first oxide semiconductor layer 71.

The intermediate oxide semiconductor layer 70 is not particularly limited and may include, for example, In and Zn. The atomic ratio of In and the atomic ratio of Zn to all the metallic elements included in the intermediate oxide semiconductor layer 70 may be approximately identical to each other. The intermediate oxide semiconductor layer 70 may have an intermediate energy gap between the energy gaps of the first oxide semiconductor layer 71 and the second oxide semiconductor layer 72.

In the present embodiment, the intermediate oxide semiconductor layer 70, the first oxide semiconductor layer 71, and the second oxide semiconductor layer 72 may have mutually different compositions. "Compositions are different" means that a type or composition ratio of a metallic element included in each layer is different.

The first oxide semiconductor layer 71 is the lowermost layer of the semiconductor layer 7 and may be in contact with the upper face of the gate insulating layer 5. The second oxide semiconductor layer 72 is the uppermost layer of the semiconductor layer 7 and may form an upper face of the semiconductor layer 7. The upper face of the second oxide semiconductor layer 72 may be in contact with the source electrode 8, the drain electrode 9, and an interlayer insulating layer 13. It is preferable that the intermediate oxide semiconductor layer 70 be arranged between the first oxide semiconductor layer 71 and the second oxide semiconductor layer 72 to be in contact with both the first oxide semiconductor layer 71 and the second oxide semiconductor layer 72. This effectively improves the interface between the first oxide semiconductor layer 71 and the second oxide semiconductor layer 72.

The semiconductor layer 7 includes a channel region 7c and a source contact region 7s and a drain contact region 7d that are positioned on both sides of the channel region. The source electrode 8 is formed to be in contact with the source contact region 7s, and the drain electrode 9 is formed to be in contact with the drain contact region 7d. In the present specification, the "channel region 7c" indicates a region including a section where a channel is formed, the section being positioned between the source contact region 7s and the drain contact region 7d, out of the semiconductor layer 7 when viewed from the normal direction of the substrate 1. In the present embodiment, a channel can be formed at or near the gate insulating layer 5 in the first oxide semiconductor layer 71, out of the channel region 7c.

The TFT 101 is covered with the interlayer insulating layer 13. The interlayer insulating layer 13 may have a layered structure. For example, the interlayer insulating layer 13 may include an inorganic insulating film (passivation film) and an organic insulating film arranged thereon. The passivation film may be arranged to be in contact with the channel region of the semiconductor layer 7.

In the TFT 101 of the present embodiment, a channel is formed in the first oxide semiconductor layer 71 having a high mobility. In addition, the intermediate oxide semiconductor layer 70 is arranged between the first oxide semiconductor layer 71 and the second oxide semiconductor layer 72, so that the occurrence of the inconsistency of the crystal lattices on the interface between the first oxide semiconductor layer 71 and the second oxide semiconductor layer 72 can be prevented. Thus, the semiconductor layer 7 having a forwardly tapered shape can be obtained by etching the oxide semiconductor layered film. The constricted part 28 as illustrated in FIG. 9B is not produced on the side face of the semiconductor layer 7. Consequently, in the etching process to separate the source from the drain, part of the source conductive film can be prevented from being left (film residue) in the constricted part 28. In addition, in the etching process, process damage that the first oxide semiconductor layer 71 suffers can be reduced by the second oxide semiconductor layer 72. Thus, a variation in TFT characteristics or a minus shift of a threshold voltage of the TFT can be suppressed, and the oxide semiconductor TFT having a high mobility and a high degree of reliability can be achieved.

Composition and Thickness of Each Layer of Semiconductor Layer 7

It is preferable that the first oxide semiconductor layer 71, for example, be a high-mobility layer having a higher mobility than the second oxide semiconductor layer 72. It is preferable that the second oxide semiconductor layer 72, for example, be a high-crystalline layer having a higher crystallinity than the first oxide semiconductor layer 71. An energy gap G1 of the first oxide semiconductor layer 71 may be lower than an energy gap G2 of the second oxide semiconductor layer 72.

The intermediate oxide semiconductor layer 70 is only required to be a layer capable of improving the interface between the first oxide semiconductor layer 71 and the second oxide semiconductor layer 72. An energy gap Gm of the intermediate oxide semiconductor layer 70 may be higher than the energy gap G1 of the first oxide semiconductor layer 71 and lower than the energy gap G2 of the second oxide semiconductor layer 72 (G1<Gm<G2).

Hereinafter, preferable composition of each layer will be described. In the description below, an atomic ratio of In (composition ratio) to all the metallic elements comprising the oxide semiconductor is abbreviated to "an In ratio", and an atomic ratio of Zn to all the metallic elements comprising the oxide semiconductor is abbreviated to a "Zn ratio". For example, the In ratio of In—Ga—Zn—O based semiconductor layer is a ratio of the number of atoms of In to the total number of atoms of In, Ga, and Zn. When the number of atoms of In denotes [In], the number of atoms of Ga denotes [Ga], and the number of atoms of zinc denotes [Zn], the In ratio is represented as [In]/([In]+[Ga]+[Zn]).

The In ratio of the first oxide semiconductor layer 71, which is a high-mobility layer, is higher than the Zn ratio ([In]>[Zn]). The In ratio of the first oxide semiconductor layer 71, for example, may be higher than 0.3. When the first oxide semiconductor layer 71 is the In—Ga—Zn—O based semiconductor layer, the Ga ratio, that is, a ratio of the number of atoms of Ga to the total number of atoms In, Ga, and Zn is lower than the Zn ratio and the In ratio, for example. The Ga ratio may be less than 0.3.

One example of a preferable composition range of the first oxide semiconductor layer 71 in the case where the first oxide semiconductor layer 71 is the In—Ga—Zn—O based semiconductor layer is as follows.

[In]/([In]+[Ga]+[Zn])>0.3

[In]>[Ga],[In]>[Zn],[Zn]>[Ga]

[Ga]/([In]+[Ga]+[Zn])<0.3

The atomic ratios In:Ga:Zn of In, Ga, and Zn of the first oxide semiconductor layer 71 may be approximately 5:1:4 (for example, 4 to 6:0.8 to 1.2:3.2 to 4.8). As one example, when an oxide semiconductor film is formed using a sputtering target in which the atomic ratios In:Ga:Zn are 5:1:4, the composition of the first oxide semiconductor layer 71 after being formed can be included in the aforementioned range even if an error occurs in the process, or impurities are doped.

Meanwhile, the Zn ratio of the second oxide semiconductor layer 72, which is a high-crystalline layer, is higher than the In ratio ([Zn]>[In]). The Zn ratio may be higher than 0.5 for example. When the second oxide semiconductor layer 72 is the In—Ga—Zn—O based semiconductor layer, the Zn ratio may be higher than the sum of the Ga ratio and the In ratio. In addition, the Ga ratio may be higher than the In ratio, for example.

One example of a preferable composition range of the second oxide semiconductor layer 72 in the case where the second oxide semiconductor layer 72 is the In—Ga—Zn—O based semiconductor layer is as follows.

[Zn]/([In]+[Ga]+[Zn])>0.5

[Zn]>[In]+[Ga]

[In]<[Ga]

The atomic ratios In:Ga:Zn of In, Ga, and Zn of the second oxide semiconductor layer 72 may be approximately 1:3:6 (for example, 0.8 to 1.2:2.4 to 3.6:4.8 to 7.2). As one example, when an oxide semiconductor film is formed using a sputtering target in which the atomic ratios In:Ga:Zn are 1:3:6, the composition of the second oxide semiconductor layer 72 after being formed can be included in the aforementioned range even if an error occurs in the process or impurities are doped.

A specific composition in a case where the In—Ga—Zn—O based semiconductor is used for the first oxide semiconductor layer 71 and the second oxide semiconductor layer 72 is exemplified below.

The first oxide semiconductor layer 71 may include In—Ga—Zn—O based oxides of composition (atomic ratio) below or oxide semiconductors in the vicinity of its composition: In:Ga:Zn=3:1:2 (=3/6:1/6:2/6), In:Ga:Zn=4:2:3 (=4/9:2/9:3/9), In:Ga:Zn=5:1:3 (=5/9:1/9:3/9), In:Ga:Zn=5:3:4 (=5/12:3/12:4/12), In:Ga:Zn=6:2:4 (=6/12:2/12:4/12), In:Ga:Zn=7:1:3 (=7/11:1/11:3/11), or In:Ga:Zn=5:1:4 (=5/10:1/10:4/10).

The second oxide semiconductor layer 72 may include In—Ga—Zn—O based oxides of composition (atomic ratio) below or oxide semiconductors in the vicinity of its composition: In:Ga:Zn=1:3:2 (=1/6:3/6:2/6), In:Ga:Zn=2:4:3 (=2/9:4/9:3/9), In:Ga:Zn=1:5:3 (=1/9:5/9:3/9), or In:Ga:Zn=1:3:6 (=1/10:3/10:6/10).

The intermediate oxide semiconductor layer 70 is not particularly limited but may include a composition capable of maintaining an amorphous state without being crystallized. When the intermediate oxide semiconductor layer 70 is the In—Ga—Zn—O based semiconductor layer, the atomic ratios In:Ga:Zn of In, Ga, and Zn may be approximately 1:1:1 (for example, 0.8 to 1.2:0.8 to 1.2:0.8 to 1.2). As one example, when the intermediate oxide semiconductor layer 70 is formed using a sputtering target in which the atomic ratios In:Ga:Zn are 1:1:1, the composition of the intermediate oxide semiconductor layer 70 after being formed can be included in the aforementioned range even if an error occurs in the process or impurities are doped.

Note that the composition of each layer of the semiconductor layer 7 in not limited to the aforementioned composition. For example, an In—Sn—Zn—O based semiconductor layer, an In—Al—Sn—Zn—O based semiconductor layer, or the like can be used in place of the In—Ga—Zn—O based semiconductor layer. In addition, the semiconductor layer 7 is only required to include the first oxide semiconductor layer 71, the intermediate oxide semiconductor layer 70, and the second oxide semiconductor layer 72 in a predetermined order, and may include a multilayer structure having four layers or more.

The thickness of each layer is not particularly limited, but it is preferable that the thickness of the first oxide semiconductor layer 71 be 1 nm or more and 50 nm or less, for example. It is preferable that the thickness of the second oxide semiconductor layer 72 be 20 nm or more and 130 nm or less, for example. It is preferable that the thickness of the intermediate oxide semiconductor layer 70 be 15 nm or more and 80 nm or less, for example. When the thickness of the first oxide semiconductor layer 71 is 1 nm or more, electrons move more preferentially in the first oxide semiconductor layer 71 than in the second oxide semiconductor layer 72, hence a TFT having a high mobility can be achieved. Meanwhile, when the thickness of the first oxide semiconductor layer 71 is 50 nm or less, it is possible to perform on/off operations of the TFT at a high speed on the basis of a gate voltage. When the thickness of the second oxide semiconductor layer 72 is 20 nm or more, the process damage of the first oxide semiconductor layer 71 in the source/drain separation process can be effectively reduced. Meanwhile, when the thickness of the second oxide semiconductor layer 72 is 130 nm or less, a resistance component caused by the second oxide semiconductor layer 72 can be reduced, and reduction in mobility of the TFT can be suppressed. Further, when the thickness of the intermediate oxide semiconductor layer 70 is 15 nm or more, the interface between the first oxide semiconductor layer 71 and the second oxide semiconductor layer 72 can be effectively improved. Meanwhile, when the thickness of the intermediate oxide semiconductor layer 70 is 80 nm or less, reduction in the threshold voltage due to the insertion of the intermediate oxide semiconductor layer 70 can be suppressed.

Structure of Active Matrix Substrate

The present embodiment can be applied to the active matrix substrate of a display device, for example. When the present embodiment is applied to the active matrix substrate, at least part of a plurality of TFTs provided on the active matrix substrate may be the TFT 101 having the aforementioned three-layer channel structure. For example, a pixel TFT arranged in each pixel and/or a TFT (circuit TFT) that constitutes a monolithic drive may be the TFT 101.

The active matrix substrate includes a display region (active region) contributing to display and a peripheral region (frame region) positioned on the outside of the display region. In the display region, a plurality of gate bus lines G and a plurality of source bus lines S are formed, and respective regions surrounded by these lines become "pixels". A plurality of pixels are arranged in a matrix.

Figure 2:
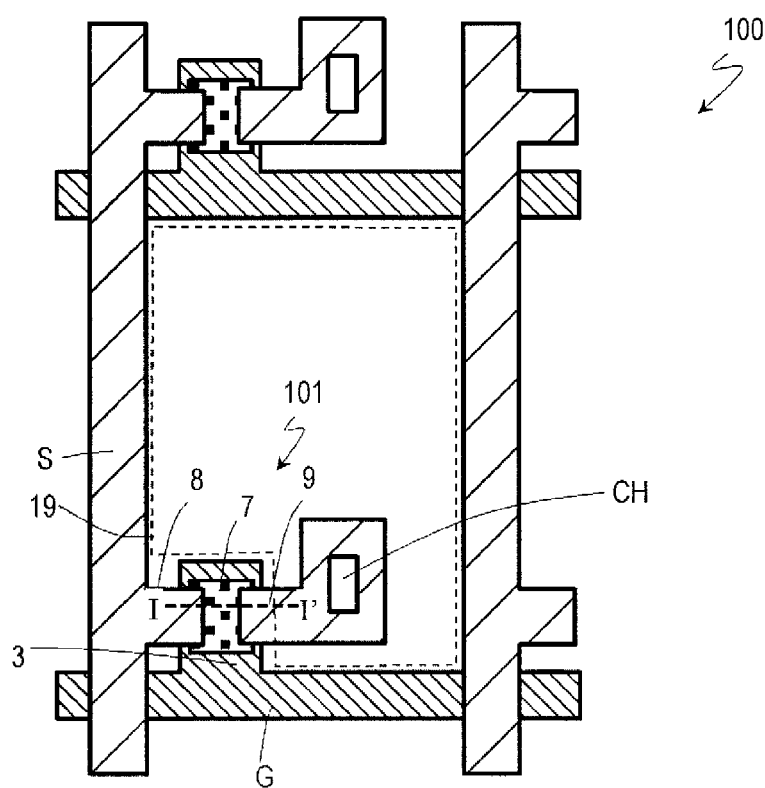
FIG. 2 is a schematic plan view illustrating one example of a semiconductor device (active matrix substrate) 100 of the first embodiment.

FIG. 2 is a plan view illustrating one example of an active matrix substrate 100 of the present embodiment. In FIG. 2, only a single pixel is illustrated. In this example, the TFT 101 functions as a pixel TFT.

As illustrated in FIG. 2, each pixel includes the TFT 101 that is a pixel TFT, and a pixel electrode 19. The pixel electrode 19 is separated for each pixel. The TFT 101 is formed at or near each of intersections of the plurality of gate bus lines G and the plurality of source bus lines S. The drain electrode 9 of the TFT 101 is electrically connected to the pixel electrode 19 corresponding thereto. The pixel electrode 19 may be connected to the drain electrode 9 in a contact hole CH provided in the interlayer insulting layer 13. The source bus line S is electrically connected to the source electrode 8 of the TFT 101. The source bus line S and the source electrode 8 may be integrally formed. The gate bus line G is electrically connected to the gate electrode 3 of the TFT 101. The gate bus line G and the gate electrode 3 may be integrally formed. The active matrix substrate 100 may further include another electrode layer that functions as a common electrode on the pixel electrode 19 or between the interlayer insulting layer 13 and the pixel electrode 19.

Manufacturing Method of TFT 101

Hereinafter, a manufacturing method of the TFT 101 will be specifically described with reference to FIG. 1 again.

First, the gate electrode 3 and the gate bus line G are formed on the substrate 1. A glass substrate, a silicon substrate, a plastic substrate (resin substrate) having heat resistance, or the like, can be used, for example, as the substrate 1. The gate electrode 3 can be formed integrally with the gate bus line G. Herein, a not-illustrated metal film for gate wiring lines (with a thickness of 50 nm or more and 500 nm or less) is formed on the substrate 1 (e.g., glass substrate) by a sputtering method or the like. Next, the metal film for gate wiring lines is patterned to obtain the gate electrode 3 and the gate bus line G. As the conductive film for gate wiring lines, for example, a layered film (W/TaN film) formed of a W film having a thickness 300 nm as an upper layer and a TaN film having a thickness of 20 nm as a lower film is used. Note that the material of the metal film for gate wiring lines is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used.

Subsequently, the gate insulating layer 5 is formed on the gate electrode 3 and the gate bus line G. The gate insulating layer 5 can be formed by a CVD method or the like. As the gate insulating layer 5, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 5 may have a layered structure. For example, the silicon nitride layer, the silicon oxide nitride layer, and the like are formed on the substrate 1 side (lower layer) to prevent the diffusion of impurities or the like from the substrate, and then the silicon oxide layer, the silicon nitride oxide layer and the like are formed on a layer thereon (upper layer) to secure insulating properties. Here, a layered film formed of a $SiO_2$ film having a thickness 50 nm as an upper layer and a SiNx film having a thickness of 300 nm as a lower film is used. Thus, when an insulating layer including oxygen (for example, an oxide layer such as $SiO_2$) is used as the uppermost layer of the gate insulating layer 5 (that is, a layer that is in contact with the oxide semiconductor layer), and an oxygen deficiency occurs in the semiconductor layer 7, the oxygen deficiency can be remedied by the oxygen included in the oxide layer, and thus the oxygen deficiency in the semiconductor layer 7 can be reduced.

Subsequently, the semiconductor layer 7, which includes the first oxide semiconductor layer 71, the intermediate oxide semiconductor layer 70, and the second oxide semiconductor layer 72 in this order from the gate insulating layer 5 side, is formed on the gate insulating layer 5.

The formation of the semiconductor layer 7 is performed as follows.

First, an oxide semiconductor layered film including a first oxide semiconductor film, an intermediate oxide semiconductor film, and a second oxide semiconductor film is formed, for example, by a sputtering method. The first oxide semiconductor film, the intermediate oxide semiconductor film, and the second oxide semiconductor film each include composition and thickness corresponding to the first oxide semiconductor layer 71, the intermediate oxide semiconductor layer 70, and the second oxide semiconductor layer 72. The first and second oxide semiconductor films may be, for example, a crystalline oxide semiconductor film, and the intermediate oxide semiconductor film may be, for example, an amorphous oxide semiconductor film. Note that whether an oxide semiconductor film is crystalline or amorphous is determined, for example, by the composition of an oxide semiconductor, a condition of film formation, and the like.

Here, a crystalline In—Ga—Zn—O based semiconductor film is formed as the first oxide semiconductor film and the second oxide semiconductor film, and an amorphous In—Ga—Zn—O based semiconductor film is formed as the intermediate oxide semiconductor film.

The first oxide semiconductor film is formed by the sputtering method, for example, using a target in which atomic ratios In:Ga:Zn are 5:1:4. As sputtering gas (atmosphere), mixed gas of noble gas atoms such as argon and oxidative gas can be used. The oxidative gas includes $O_2$, $CO_2$, $O_3$, $H_2O$, $N_2O$, and the like. Here, mixed gas including Ar gas and oxygen ($O_2$) gas is used. A ratio of the oxygen gas during film formation by the sputtering method is set, for example, to 5 percent or more and 20 percent or less in terms of a partial pressure ratio. In addition, a substrate temperature during film formation is set, for example, to 100 to 180 degrees Celsius. The pressure (sputtering pressure) of gaseous atmosphere is not particularly limited to specific pressure as long as the pressure is in a range in which the plasma can be stably electrically discharged, and for example, the pressure is set to 0.1 to 3.0 Pa.

The intermediate oxide semiconductor film is formed by the sputtering method, for example, using a target in which atomic ratios In:Ga:Zn are 1:1:1. As sputtering gas, mixed gas including Ar gas and oxygen ($O_2$) gas is used. A ratio of the oxygen gas during film formation by the sputtering method is set, for example, higher than 0 percent and equal to or less than 10 percent in terms of a partial pressure ratio. The substrate temperature and the sputtering pressure during film formation may be identical to the substrate temperature and the sputtering pressure in the case of forming the first oxide semiconductor film.

The second oxide semiconductor film is formed by the sputtering method, for example, using a target in which atomic ratios In:Ga:Zn are 1:3:6. As sputtering gas, mixed gas including Ar gas and oxygen ($O_2$) gas is used. A ratio of the oxygen gas during film formation by the sputtering method is higher than a ratio of the oxygen gas during the film formation of the intermediate oxide semiconductor film, and for example, set higher than 0 percent and equal to or less than 20 percent in terms of a partial pressure ratio. The substrate temperature and the sputtering pressure during film formation may be identical to the substrate temperature and the sputtering pressure in the case of forming the first oxide semiconductor film.

The thickness of each oxide semiconductor film is not particularly limited, and for example, the thickness of the first oxide semiconductor film is 1 nm or more and 50 nm or less, the thickness of the intermediate oxide semiconductor film is 15 nm or more and 80 nm or less, and the thickness of the second oxide semiconductor film is 20 nm or more and 130 nm or less. Here, the thickness of the first oxide semiconductor film is 10 nm, and the thickness of the intermediate oxide semiconductor film is 40 nm, and the thickness of the second oxide semiconductor film is 50 nm.

Subsequently, the anneal treatment of the oxide semiconductor layered film is performed. Here, heat treatment is performed at a temperature of 300 degrees Celsius or higher and 500 degrees Celsius or less under atmosphere. A time of the heat treatment is, for example, 30 minutes or longer and two hours or less.

Subsequently, patterning of the oxide semiconductor layered film after the heat treatment is performed, whereby the semiconductor layer 7 is obtained. The patterning of the oxide semiconductor layered film is performed, for example, by wet etching using a phosphoric acetic and nitric acid based etching solution. This provides the semiconductor layer 7 having the layered structure, which includes the first oxide semiconductor layer 71, the intermediate oxide semiconductor layer 70, and the second oxide semiconductor layer 72 in this order from the gate insulating layer 5 side.

Figure 3:
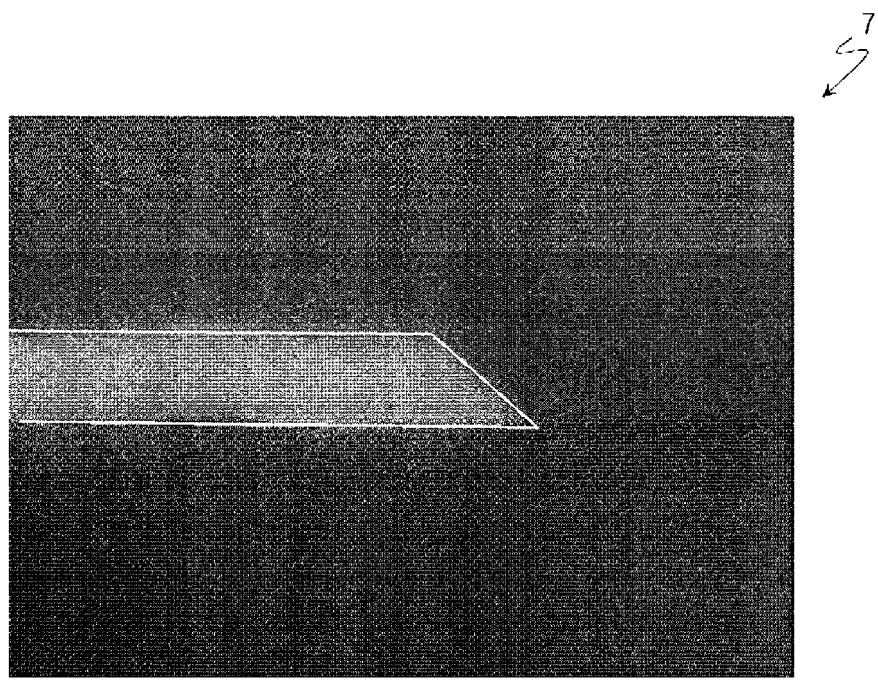
FIG. 3 is a diagram exemplifying an SEM image of a cross section of a semiconductor layer 7 of the TFT 101.

FIG. 3 is a diagram exemplifying an SEM image of a cross section of the semiconductor layer 7 obtained in the patterning process. For easier recognition, the outline of the semiconductor layer 7 is represented by a white line. As seen from FIG. 3, the side face of the semiconductor layer 7 may have a forwardly tapered shape. In the present embodiment, the amorphous oxide semiconductor film is arranged on the interface between the two-layer crystalline oxide semiconductor films of the semiconductor layer 7. Consequently, an etching rate in the lateral direction at or near the interface is prevented from being increased to the extreme degree due to the mismatch of the crystal lattices on the interface. As a result, conceivably, the constricted part 28, as illustrated in FIG. 9B, is not produced on the side face of the semiconductor layer 7 obtained in the patterning process.

Subsequently, the source electrode 8 and the drain electrode 9 are formed to be in contact with the upper face of the semiconductor layer 7. The source electrode 8 and the drain electrode 9 may have a single-layer structure or a layered structure. Here, as a metal film for source wiring line, a layered film is formed in which, from the semiconductor layer 7 side, three layers of a Ti film (thickness: 30 nm), an Al film (thickness: 300 nm), and a Ti film (thickness: 50 nm) are stacked or two layers of a Ti film (thickness: 30 nm) and a Cu film (thickness: 300 nm) are stacked in this order. The metal film for source wiring line is produced, for example, by the sputtering method or the like.

Subsequently, the source electrode 8 and the drain electrode 9 are obtained by patterning the metal film for source wiring line (source/drain separation). In the present embodiment, as described above with reference to FIG. 3, a recess such as a constricted part is not formed on the side face of the semiconductor layer 7. Thus, a film residue is unlikely to occur in the patterning process of the metal film for source wiring line.

The source electrode 8 is arranged to be in contact with the source contact region of the semiconductor layer 7 and the drain electrode 9 is arranged to be in contact with the drain contact region of the semiconductor layer 7. A section positioned between the source electrode 8 and the drain electrode 9 of the semiconductor layer 7 serves as a channel region. In this process, in some cases, the surface portion of the second oxide semiconductor layer 72 is etched (overetching). Subsequently, oxidation treatment, for example, plasma treatment using $N_2O$ gas may be performed on the channel region of the semiconductor layer 7. In this manner, the TFT substrate 101 is obtained.

Subsequently, the interlayer insulating layer 13 is formed to be in contact with the channel region of the TFT 10. The interlayer insulating layer 13 may include an inorganic insulating film (passivation film) and an organic insulating film arranged thereon. The inorganic insulating layer may include a silicon oxide ($SiO_2$) film, a silicon nitride (SiNx)

film, a silicon oxynitride (SiOxNy; x>y) film, a silicon nitride oxide (SiNxOy; x>y) film or the like, for example. Here, as the inorganic insulating layer, a SiO$_2$ layer having a thickness of 300 nm, for example, is formed by a CVD method. A formation temperature of the inorganic insulating layer may be 200 degrees Celsius or higher and 450 degrees Celsius or less, for example. Subsequently, an organic insulating layer is formed on the inorganic insulating layer. Here, a positive-working photosensitive resin film having a thickness of 2000 nm is formed, for example.

Analytic Results of Semiconductor Layer Having Layered Structure

In the aforementioned method, a layered film including a crystalline oxide semiconductor film and an amorphous oxide semiconductor film is formed by controlling the composition and condition of film formation. The inventors carried out the following analysis to verify a crystalline state of the oxide semiconductor film immediately after the film formation (before the anneal treatment) in the aforementioned method.

First, sample substrates 1 to 3 each including a single-layer semiconductor film were produced. The sample substrate 1 was produced by forming the first oxide semiconductor film on a glass substrate by the sputtering method. Similarly, the sample substrates 2 and 3 each were produced by forming the intermediate oxide semiconductor film and the second oxide semiconductor film on a glass substrate. Herein, In—Ga—Zn—O based semiconductor films are formed as the first oxide semiconductor film, the intermediate oxide semiconductor film, and the second oxide semiconductor film. The thicknesses of the In—Ga—Zn—O based semiconductor films all are 100 nm. A table 1 represents compositions of targets used in a case where the In—Ga—Zn—O based semiconductor films are formed and conditions of film formation of the In—Ga—Zn—O based semiconductor films.

TABLE 1

|  | Target Composition In:Ga:Zn | Sputtering Gas | Temperature of Film Formation |
| --- | --- | --- | --- |
| Sample Substrate 1 | 5:1:4 | Ar + O$_2$ 5 to 20% of Partial Pressure of O$_2$ | 110 degrees Celsius |
| Sample Substrate 2 | 1:1:1 | Ar + O$_2$ 0 to 10% of Partial Pressure of O$_2$ | |
| Sample Substrate 3 | 1:3:6 | Ar + O$_2$ 0 to 20% of Partial Pressure of O$_2$ | |

Subsequently, X-ray diffraction analysis (XRD) was conducted on each obtained sample substrate. The X-ray diffraction patterns of the sample substrates 1 to 3 are illustrated in FIGS. 4A to 4C.

Figure 4A:
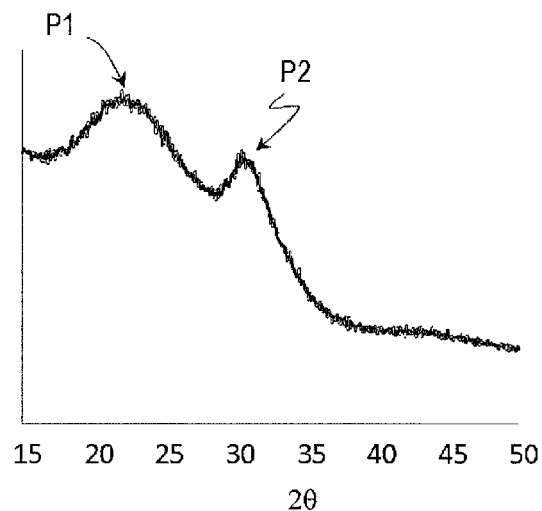
FIGS. 4A to 4C are graphs illustrating XRD analysis results of respective sample substrates 1 to 3.
Figure 4B:
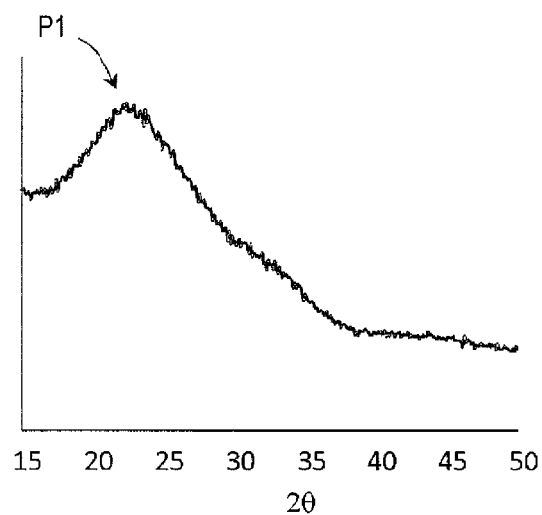
Figure 4C:
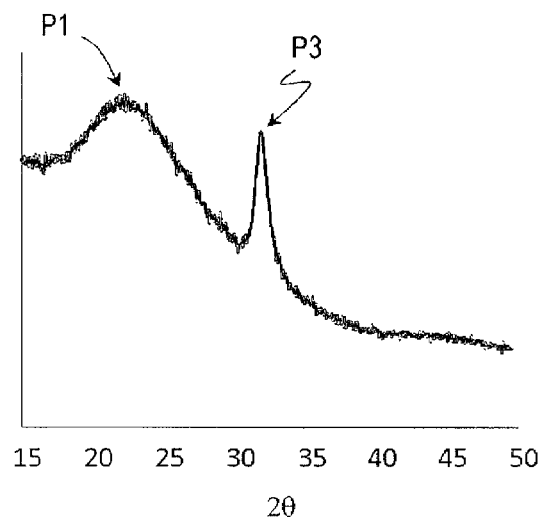

As seen in FIGS. 4A to 4C, the X-ray diffraction patterns of all the sample substrates have a broad peak P1 at 2θ=20 to 25 degrees. Conceivably, this peak is attributed to the glass substrate. As illustrated in FIG. 4A, the X-ray diffraction pattern of the sample substrate 1 has a crystalline peak P2 at or near 2θ=30 degrees, in addition to the peak P1 of the glass substrate. In addition, as illustrated in FIG. 4C, the X-ray diffraction pattern of the sample substrate 3 has a crystalline peak P3 at or near 2θ=32 degrees, in addition to the peak P1 of the glass substrate. Thus, it can be verified that the semiconductor films of the sample substrates 1 and 3 both are crystalline. The peak P3 of the sample substrate 3 has a more pointed shape (the width of the peak is narrow) than the peak P2 of the sample substrate 1, and thus it is understood that the semiconductor film of the sample substrate 3 has a higher crystallinity. In contrast, no crystalline peak is not found in the sample substrate 2, and thus it is verified that the semiconductor film on the sample substrate 2 is amorphous.

Note that even when the aforementioned anneal treatment is performed for the sample substrate 2, an amorphous state in the intermediate oxide semiconductor film is maintained. In some cases, when the anneal treatment is performed on the sample substrates 1 and 3, the crystallinity of the first and second oxide semiconductor films is further increased.

As described above, the single-layer semiconductor film is formed on the substrate, and its crystalline state has been studied. However, when a disposed semiconductor layer is formed by stacking a plurality of semiconductor films. it is difficult to individually check the crystalline state of each semiconductor film on the basis of the XRD analysis. The crystalline state of each layer in the laminated semiconductor layer can be checked, for example, by TEM observation of the cross section of the laminated semiconductor layer. In addition, the composition of each layer in the laminated semiconductor layer can be analyzed, for example, by XPS, AES, and the like.

Evaluation of TFT Characteristics

The inventors produced sample substrates A and B including a plurality of TFTs and studied variations in TFT characteristics of each sample substrate, and its results are described below.

First, a sample substrate A was produced by simultaneously forming a plurality of TFTs on a glass substrate by a method same as the manufacturing method of the aforementioned TFT 101 (FIG. 1). The TFT of the sample substrate A has a three-layer structure including the In—Ga—Zn—O based semiconductor (thickness: 10 nm) in which the atomic ratios In:Ga:Zn of In, Ga, and Zn are 5:1:4 as the first oxide semiconductor layer, the In—Ga—Zn—O based semiconductor (thickness: 50 nm) in which the atomic ratios In:Ga:Zn of In, Ga, and Zn are 1:3:6 as the second oxide semiconductor layer, and the In—Ga—Zn—O based semiconductor (thickness: 40 nm) in which the atomic ratios In:Ga:Zn of In, Ga, and Zn are 1:1:1 as the intermediate oxide semiconductor layer.

In addition, the sample substrate B was produced by simultaneously forming a plurality of TFTs on a glass substrate by a method same as that of the sample substrate A except that the intermediate oxide semiconductor layer was not formed. The TFT of the sample substrate B has a two-layer channel structure including the In—Ga—Zn—O based semiconductor (thickness: 10 nm) in which the atomic ratios In:Ga:Zn of In, Ga, and Zn are 5:1:4 and the In—Ga—Zn—O based semiconductor (thickness: 50 nm) in which the atomic ratios In:Ga:Zn of In, Ga, and Zn are 1:3:6 (see FIG. 9A).

Figure 5A:
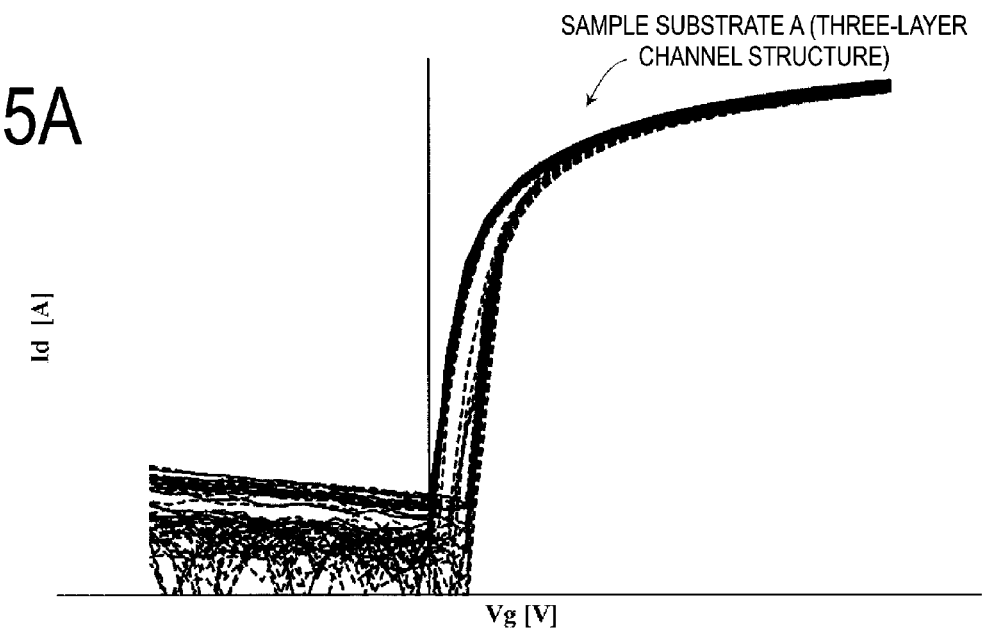
FIGS. 5A and 5B are graphs illustrating respective measurement results of I-V characteristics of a plurality of TFTs formed on sample substrates A and B.
Figure 5B:
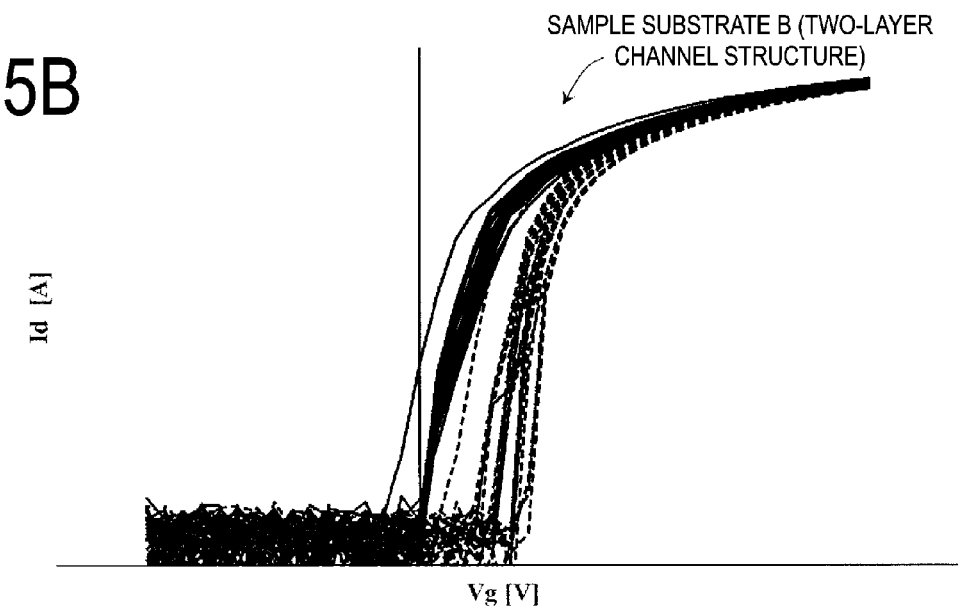

Subsequently, I-V characteristics of the plurality of TFTs formed on each sample substrate were measured. Measurement results are illustrated in FIGS. 5A and 5B. In FIGS. 5A and 5B, measurement results obtained by changing a gate voltage Vg from a minus side to a plus side are illustrated by solid lines, and measurement results obtained by changing the gate voltage Vg from the plus side to the minus side are illustrated by dashed lines.

From the measurement results, it is verified that the variations in TFT characteristics in the sample substrate A are suppressed greater than those in the sample substrate B. In particular, it was found that the sample substrate B includes TFTs whose threshold voltages are substantially shifted to the minus side. Conceivably, this is because a film residue was produced in the constricted part on the side face of the semiconductor layer in the source/drain separation process.

In the aforementioned analysis, the crystalline oxide semiconductor layer was used as the first oxide semiconductor layer 71 and the second oxide semiconductor layer 72, and the amorphous oxide semiconductor layer was used as the intermediate oxide semiconductor layer 70. Note that the composition and crystalline state of each layer are not limited to the examples described above. It is possible to improve the interface between the first oxide semiconductor layer 71 and the second oxide semiconductor layer 72 while securing respective functions of the first oxide semiconductor layer 71 and the second oxide semiconductor layer 72, by arranging the intermediate oxide semiconductor layer (for example, an oxide semiconductor layer in which the In ratio and the Zn ratio are approximately identical to each other), which has a composition intermediate between the first oxide semiconductor layer 71 and the second oxide semiconductor layer 72 or an energy gap intermediate between the first oxide semiconductor layer 71 and the second oxide semiconductor layer 72, between the first oxide semiconductor layer 71 that has a high mobility and functions as a channel layer and the second oxide semiconductor layer 72 that has high barrier properties and etching tolerability.

Regarding TFT Structure

As illustrated in FIG. 1, the channel structure of the present embodiment can preferably be applied to the channel etch-type TFT having a top contact structure. When the channel structure is applied to this TFT, a film residue caused in the source/drain separation process or process damage to the first oxide semiconductor layer can be suppressed, hence more remarkable effects can be obtained.

Note that the structure of the TFT to which the channel structure of the present embodiment can be applied is not particularly limited. The TFT 101 illustrated in FIG. 1 has the top contact structure in which the source and drain electrodes are in contact with the upper face of the semiconductor layer, but may have a bottom contact structure in which the source and drain electrodes are in contact with the lower face of the semiconductor layer. The TFT that has the bottom contact structure does not cause the problem of the film residue described above. However, when the constricted part is produced on the side face of the semiconductor layer, in some cases, the coatability of an insulating film, such as a passivation film, on the side face of the semiconductor layer are reduced, and TFTs having high reliability may not be obtained.

In addition, the TFT of the present embodiment may have a channel etched structure or an etch stop structure. As illustrated in FIG. 1, the channel etch type TFT does not include an etch stop layer formed on the channel region, and a lower face of an end portion on the channels side of each of the source and drain electrodes is arranged so as to be in contact with an upper face of the semiconductor layer. The channel etched type TFT is formed, for example, by forming a conductive film for the source and drain electrodes on the oxide semiconductor layer and separating the conductive film into the source and the drain. In the source/drain separation process, a surface portion of the channel region may be etched.

In the etch stop type TFT, an etch stop layer is formed on the channel region. The lower face of an end portion on the channel side of each of the source and drain electrodes is positioned, for example, on the etch stop layer. The etch stop type TFT is formed, for example, by forming an etch stop layer covering a portion that serves as the channel region of the oxide semiconductor layer, then forming a conductive film for the source and drain electrodes on the oxide semiconductor layer and the etch stop layer, and separating the conductive film into the source and the drain. In the etch stop type TFT, the side face of the semiconductor layer is covered with the etch stop layer, whereby the production of the aforementioned film residue can be suppressed. However, when the constricted part is produced on the side face of the semiconductor layer, in some cases, the coatability of the etch stop layer on the side face of the semiconductor layer is reduced, and TFTs having high reliability cannot be obtained.

The TFT 101 illustrated in FIG. 1 is a TFT having the bottom gate structure in which the gate electrode 3 is arranged between the semiconductor layer 7 and the substrate 1, but may be a TFT having the top gate structure in which the gate electrode 3 is arranged on the opposite side of the semiconductor layer 7 to the substrate 1.

Figure 6:
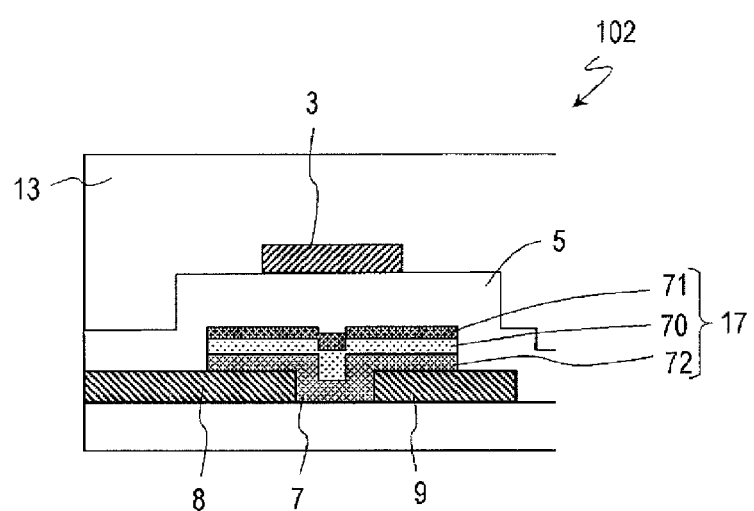
FIG. 6 is a cross-sectional view illustrating a modified example of the TFT of the first embodiment.

FIG. 6 is a cross-sectional view illustrating an example of modification of the TFT according to the present embodiment. In FIG. 6, the same reference numerals are attached to the same constituent elements as those in FIG. 1.

A TFT 102 of the modification is of a bottom contact type and has the top gate structure. In the TFT 102, a semiconductor layer 17 is arranged to be in contact with the upper faces of the source electrode 8 and the drain electrode 9. The semiconductor layer 17 is covered with the gate insulating layer 5. In the gate insulating layer 5, the gate electrode 3 is provided to overlap at least part (portion positioned between the source electrode 8 and the drain electrode 9) of the semiconductor layer 17 when viewed from the normal direction of the substrate 1.

In the semiconductor layer 17 of the TFT 102, the first oxide semiconductor layer 71 is arranged above the second oxide semiconductor layer 72 (that is, on the gate insulating layer 5 side). In this example, the semiconductor layer 17 has the layered structure including the second oxide semiconductor layer 72, the intermediate oxide semiconductor layer 70, and the first oxide semiconductor layer 71 in this order from the substrate 1 side. The upper face of the first oxide semiconductor layer 71 is in contact with the gate insulating layer 5.

In the top gate structure TFT, when the constricted part is produced on the side face of the semiconductor layer, the coatability of the gate insulating layer on the side face of the semiconductor layer might be reduced. In contrast, in the TFT 102, the processability of the semiconductor layer 17 is increased. whereby the reduction in the coatability of the gate insulating layer 5 is suppressed, and high reliability can be obtained.

Regarding Oxide Semiconductor

The oxide semiconductor included in the semiconductor layer 7 may be an amorphous oxide semiconductor, a polycrystalline oxide semiconductor, a microcrystalline oxide semiconductor, a crystalline oxide semiconductor having a c axis aligned substantially perpendicular to a layer face, and the like. The first oxide semiconductor layer 71 and the second oxide semiconductor layer 72 may have mutually different crystalline structures. The energy gap of the second oxide semiconductor layer 72 is preferably greater than the energy gap of the first oxide semiconductor layer 71. However, when a difference between the energy gaps of these layers is relatively small, the energy gap of the first oxide semiconductor layer 71 may be greater than the energy gap of the second oxide semiconductor layer 72.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The first oxide semiconductor layer 71, the second oxide semiconductor layer 72, and the intermediate oxide semiconductor layer 70 may include, for example, at least one metallic element selected from In, Ga, and Zn. In the present embodiment, the first oxide semiconductor layer 71, the second oxide semiconductor layer 72, and the intermediate oxide semiconductor layer 70 include, for example, the In—Ga—Zn—O based semiconductor (for example, indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. The first oxide semiconductor layer 71, the second oxide semiconductor layer 72, and the intermediate oxide semiconductor layer 70 may be formed of an oxide semiconductor film including the In—Ga—Zn—O based semiconductor.

The crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. Since a TFT including an In—Ga—Zn—O based semiconductor layer has a high mobility (more than 20 times in comparison with a-Si TFTs) and low leakage current (less than 1/100th in comparison with a-Si TFTs), such a TFT can suitably be used as a drive TFT (for example, a TFT included in a driving circuit provided on the same substrate as the display region at or near a display region including a plurality of pixels) and a pixel TFT (TFT provided in a pixel).

The first oxide semiconductor layer 71, the second oxide semiconductor layer 72, and the intermediate oxide semiconductor layer 70 may include another oxide semiconductor, in place of the In—Ga—Zn—O based semiconductor. For example, an In—Sn—Zn—O based semiconductor (e.g., $In_2O_3$—$SnO_2$—ZnO; InSnZnO) may be included. The In—Sn—Zn—O based semiconductor is a ternary oxide of In (indium), Sn (tin), and Zn (zinc). Alternatively, the first oxide semiconductor layer 71 and the second oxide semiconductor layer 72 may include an In—Al—Zn—O based semiconductor, an In—Al—Sn—Zn—O based semiconductor, an In—Zn—O based semiconductor, a Zr—In—Zn—O based semiconductor, an Hf—In—Sn—Zn—O based semiconductor, and the like. Meanwhile, the intermediate oxide semiconductor layer 70 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

Second Embodiment

A semiconductor device of a second embodiment is different from that of the first embodiment in that the semiconductor layer of a TFT includes In, Zn and Sn.

A TFT of the second embodiment includes the same structure as that of the TFT 101 illustrated in FIG. 1. However, an oxide semiconductor layer including In, Sn and Zn is used as the first oxide semiconductor layer 71. For example, an In—Sn—Zn—O based semiconductor layer or an In—Al—Sn—Zn—O based semiconductor layer may be used. The first oxide semiconductor layer 71 may be crystalline.

The second oxide semiconductor layer 72 may be an oxide semiconductor layer that includes In and Zn but does not include Sn. As the second oxide semiconductor layer 72, for example, the In—Ga—Zn—O based semiconductor layer similar to that of the first embodiment can be used. The second oxide semiconductor layer 72 may be crystalline.

An oxide semiconductor including Sn, such as the In—Sn—Zn—O based semiconductor, may have a higher mobility than the In—Ga—Zn—O based semiconductor. Thus, when the oxide semiconductor including Sn is used for the first oxide semiconductor layer 71, a TFT having a higher mobility can be obtained. Meanwhile, it is preferable that the second oxide semiconductor layer 72 does not include Sn that is easily deoxidized. In the oxide semiconductor that does not include Sn, reduction in oxygen density due to deoxidation of metal is unlikely to occur. Thus, the oxide semiconductor layer that does not include Sn (for example, the In—Ga—Zn—O based semiconductor layer) is less likely to be subjected to low resistance than an oxide semiconductor layer including Sn and may be suitably used for the second oxide semiconductor layer 72 that is a protection layer of the first oxide semiconductor layer 71.

The composition of the intermediate oxide semiconductor layer 70 is not particularly limited to specific composition. The intermediate oxide semiconductor layer 70 may be amorphous. As an intermediate oxide semiconductor layer 70, for example, the oxide semiconductor layer similar to that of the first embodiment can be used.

Third Embodiment

Hereinafter, a third embodiment of a semiconductor device according to the disclosure will be described with reference to drawings. The semiconductor device of the disclosure is an active matrix substrate including an oxide semiconductor TFT and a crystalline silicon TFT that are formed on the same substrate.

The active matrix substrate includes a TFT (pixel TFT) for each pixel. As the pixel TFT, for example, an oxide semiconductor TFT in which the In—Ga—Zn—O based semiconductor layer is provided as an active layer is used.

In some cases, part or whole of a peripheral driving circuit is integrally formed on the same substrate, on which the pixel TFTs are provided. Such an active matrix substrate is referred to as a driver monolithic active matrix substrate. In the driver monolithic active matrix substrate, the peripheral driving circuit is provided in a region (non-display region or frame region) except for a region (display region) including a plurality of pixels. As TFTs (circuit TFTs) comprising the peripheral driving circuit, for example, crystalline silicon TFTs in which a polycrystalline silicon film is provided as an active layer are used. Thus, when the oxide semiconductor TFTs are used as the pixel TFTs and the crystalline silicon TFTs are used as the circuit TFTs, it is possible to reduce power consumption in the display region and moreover diminish the frame region.

As the pixel TFTs, the TFTs 101 (FIG. 1) of the first and second embodiments can be applied. A specific example will be described later.

Next, a specific configuration of the active matrix substrate of the present embodiment will be described with reference to drawings.

Figure 7:
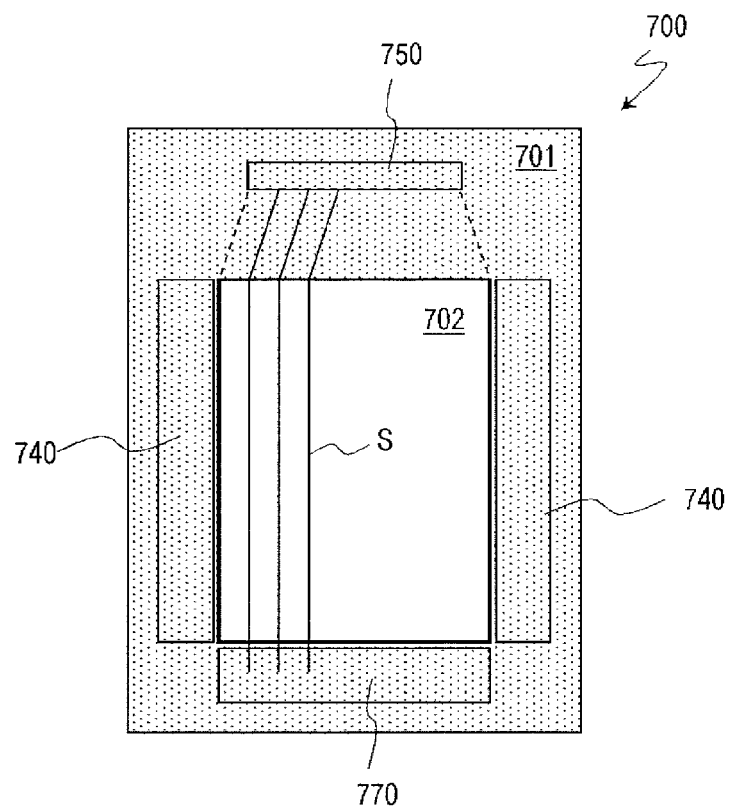
FIG. 7 is a schematic plan view illustrating one example of a semiconductor device (active matrix substrate) 700 of a third embodiment.
Figure 8:
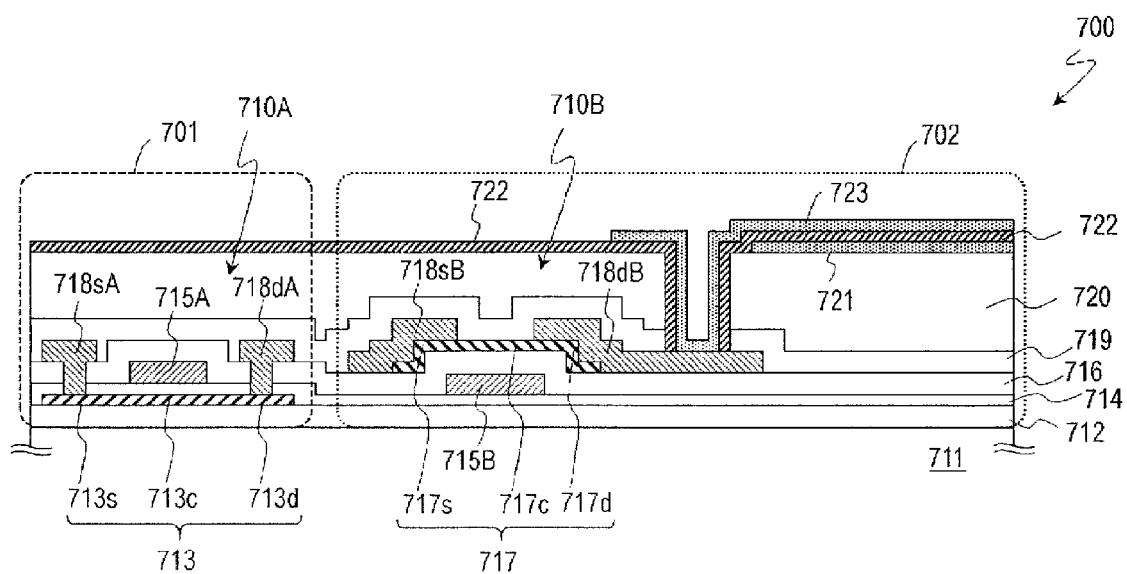
FIG. 8 is a cross-sectional view of a crystalline silicon TFT 710A and an oxide semiconductor TFT 710B in an active matrix substrate 700.

FIG. 7 is a schematic plan view illustrating one example of a planar structure of an active matrix substrate 700 of the present embodiment, and FIG. 8 is a cross-sectional view illustrating a cross-sectional structure of a crystalline silicon TFT (hereinafter referred to as a "first thin film transistor") 710A and an oxide semiconductor TFT (hereinafter referred to as a "second thin film transistor") 710B in the active matrix substrate 700.

As illustrated in FIG. 7, the active matrix substrate 700 includes a display region 702 including a plurality of pixels and a region (non-display region) except for the display region 702. The non-display region includes a driving circuit formation region 701 in which a driving circuit is provided. In the driving circuit formation region 701, for example, a gate driver circuit 740, an inspection circuit 770, and the like are provided. In the display region 702, a plurality of gate bus lines (not illustrated) extending in a row direction and a plurality of source bus lines S extending in a column direction are formed. Although not illustrated, each pixel is defined, for example, by the gate bus line and the source bus line S. Each of the gate bus lines is connected to the corresponding terminal of the gate driver circuit. Each of the source bus line S is connected to the corresponding terminal of a driver IC 750 mounted on the active matrix substrate 700.

As illustrated in FIG. 8, in the active matrix substrate 700, the second thin film transistor 710B as the pixel TFT is formed in each pixel of the display region 702, and the first thin film transistor 710A as the circuit TFT is formed in the driving circuit formation region 701.

The active matrix substrate 700 includes a substrate 711, a foundation film 712 formed on the surface of the substrate 711, the first thin film transistor 710A formed on the foundation film 712, and the second thin film transistor 710B formed on the foundation film 712. The first thin film transistor 710A is a crystalline silicon TFT including an active region that mainly includes crystalline silicon. The second thin film transistor 710B is an oxide semiconductor TFT including an active region that mainly includes oxide semiconductors. The first thin film transistor 710A and the second thin film transistor 710B are produced integrally with the substrate 711. Herein, the "active region" indicates a region where a channel in the semiconductor layer serving as an active layer of the TFT is formed.

The first thin film transistor 710A includes a crystalline silicon semiconductor layer (for example, a low-temperature polysilicon layer) 713 formed on the foundation film 712, a first insulating layer 714 for covering the crystalline silicone semiconductor layer 713, and a gate electrode 715A provided on the first insulating layer 714. A portion positioned between the crystalline silicon semiconductor layer 713 and the gate electrode 715A in the first insulating layer 714 functions as a gate insulating film of the first thin film transistor 710A. The crystalline silicon semiconductor layer 713 includes a region (active region) 713c where a channel is formed, a source region 713s and a drain region 713d that are respectively positioned on both sides of the active region. In this example, a portion overlapping the gate electrode 715A via the first insulating layer 714 in the crystalline silicon semiconductor layer 713 is the active region 713c. The first thin film transistor 710A also includes a source electrode 718sA and a drain electrode 718dA respectively connected to the source region 713s and the drain region 713d. The source electrode 718sA and the drain electrode 718dA may be provided on an interlayer insulating film (herein, a second insulating layer 716) covering the gate electrode 715A and the crystalline silicon semiconductor layer 713 and may be connected to the crystalline silicon semiconductor layer 713 in a contact hole formed in the interlayer insulating film.

The second thin film transistor 710B includes a gate electrode 715B provided on the foundation film 712, the second insulating layer 716 for covering the gate electrode 715B, and an oxide semiconductor layer 717 arranged on the second insulating layer 716. As illustrated, the first insulating layer 714 that is the gate insulating film of the first thin film transistor 710A may be extended to a region where the second thin film transistor 710B is formed. In this case, the oxide semiconductor layer 717 may be formed on the first insulating layer 714. A portion positioned between the gate electrode 715B and the oxide semiconductor layer 717 in the second insulating layer 716 functions as a gate insulating film of the second thin film transistor 710B. The oxide semiconductor layer 717 includes a region (active region) 717c where a channel is formed, a source contact region 717s and a drain contact region 717d that are respectively positioned on both sides of the active region. In this example, a portion overlapping the gate electrode 715B via the second insulating layer 716 in the oxide semiconductor layer 717 is the active region 717c. In addition, the second thin film transistor 710B further includes a source electrode 718sB and a drain electrode 718dB respectively connected to the source contact region 717s and the drain contact region 717d. Note that configuration in which the foundation film 712 is not provided on the substrate 711 can be applied.

The thin film transistors 710A and 710B are covered with a passivation film 719 and a flattering film 720. In the second thin film transistor 710B that serves as a pixel TFT, the gate electrode 715B is connected to the gate bus line (not illustrated), and the source electrode 718sB is connected to the source bus line (not illustrated), and the drain electrode 718dB is connected to a pixel electrode 723. In this example, the drain electrode 718dB is connected to the corresponding pixel electrode 723 in an opening formed in the passivation film 719 and the flattering film 720. A video signal is supplied to the source electrode 718sB via the source bus line, and a necessary electric charge is written into the pixel electrode 723 on the basis of a gate signal from the gate bus line.

Note that, as illustrated, a transparent conductive layer 721 as a common electrode may be formed on the flattering film 720, and a third insulting layer 722 may be formed from the transparent conductive layer (common electrode) 721 to the pixel electrode 723. In this case, a slit-shaped opening may be provided in the pixel electrode 723. The active matrix substrate 700 can be used for a display device of fringe-field switching (FFS) mode, for example. The FFS mode is a lateral electric field mode in which a pair of electrodes is provided on one side of a substrate, and an electric field is applied to liquid crystal molecules in a direction parallel to (lateral direction) a substrate plane. In this example, the electric field is generated that is represented by a line of electric force and that emits from the pixel electrode 723, passes a liquid crystal layer (not illustrated), further passes the slit-shaped opening of the pixel electrode 723, and leads to the common electrode 721. The electric field has a lateral component with respect to the liquid crystal layer. As a result, a lateral electric field can be applied to the liquid crystal layer. In the lateral electric field mode, the liquid crystal molecules do not rise from the substrate, hence there is an advantage that a wider viewing angle can be achieved than in a longitudinal electric field mode.

As the second thin film transistor 710B of the present embodiment, the TFTs 101 and 102 described above with reference to FIGS. 1 and 6 can be used. When the TFT 101 illustrated in FIG. 1 is used, the gate electrode 3, the gate insulating layer 5, the oxide semiconductor layer 7, the source electrode 8 and the drain electrode 9 in the TFT 101 may respectively correspond to the gate electrode 715B, the second insulating layer (gate insulating layer) 716, the oxide semiconductor layer 717, the source electrode 718sB, and the drain electrode 718dB in FIG. 7.

In addition, the thin film transistor 710B that is an oxide semiconductor TFT may be used as a TFT (inspection TFT) that constitutes the inspection circuit 770 illustrated in FIG. 7.

Not that, although not illustrated, the inspection TFT and the inspection circuit may be formed in a region where the driver IC 750 illustrated in FIG. 7 is mounted. In this case, the inspection TFT is arranged between the driver IC 750 and the substrate 711.

In the illustrated example, the first thin film transistor 710A has the top gate structure in which the crystalline silicone semiconductor layer 713 is arranged between the gate electrode 715A and the substrate 711 (the foundation film 712). Meanwhile, the second thin film transistor 710B has the bottom gate structure in which the gate electrode 715B is arranged between the oxide semiconductor layer 717 and the substrate 711 (the foundation film 712). With the structure like this being adopted, when the thin film transistors 710A and 710B of two types are integrally formed on the same substrate 711, an increase in the number of manufacturing processes or manufacturing costs can be effectively suppressed.

The TFT structures of the first thin film transistor 710A and the second thin film transistor 710B are not limited to the aforementioned structure. For example, these thin film transistors 710A and 710B may have the same TFT structure. Alternatively, the first thin film transistor 710A may have the bottom gate structure, and the second thin film transistor 710B may have the top gate structure. In addition, in the case of the bottom gate structure, as the second thin film transistor 710B, a channel etched type or an etch stop type may be eligible.

The second insulating layer 716 that is the gate insulating film of the second thin film transistor 710B may be extended to a region where the first thin film transistor 710A is formed and function as an interlayer insulating film that covers the gate electrode 715A and the crystalline silicone semiconductor layer 713 of the first thin film transistor 710A. Thus, when the interlayer insulating film of the first thin film transistor 710A and the gate insulating film of the second thin film transistor 710B are formed in the same layer (second insulating layer) 716, the second insulating layer 716 may have a layered structure. For example, the second insulating layer 716 may have a layered structure including a layer (e.g., a silicon nitride layer) having a hydrogen donating property capable of supplying hydrogen and a layer (e.g., a silicon oxide layer) having an oxygen donating property capable of supplying oxygen.

The gate electrode 715A of the first thin film transistor 710A and the gate electrode 715B of the second thin film transistor 710B may be formed in the same layer. In addition, the source electrode 718sA and the drain electrode 718dA of the first thin film transistor 710A and the source electrode 718sB and the drain electrode 718dB of the second thin film transistor 710B may be formed in the same layer.

"Being formed in the same layer" means being formed with the same film (conductive film). This suppresses an increase in the number of manufacturing processes or manufacturing costs.

The present embodiment can be suitably applied to the active matrix substrate using the oxide semiconductor TFTs. The active matrix substrate can be used for various display devices such as a liquid crystal display device, an organic EL display device, and an inorganic EL display device, and electronic devices including a display device. In the active matrix substrate, the oxide semiconductor TFT is used not only as the switching element provided in each pixel but also as a circuit element of a peripheral circuit such as a driver (monolithically provided). In this case, the oxide semiconductor TFT of the disclosure is suitably used as a circuit element since the oxide semiconductor layer having a high mobility (for example, 10 $cm^2/V$ or higher) is used as an active layer.

INDUSTRIAL APPLICABILITY

The embodiments of the disclosure can be widely used for various semiconductor devices including oxide semiconductor TFTs. For example, the embodiments can be used for circuit substrates such as the active matrix substrate, display devices such as a liquid crystal display device, an organic electroluminescence (EL) display device, an inorganic electroluminescence display device, and an MEMS display device, imaging devices such as an image sensor device, and various electronic devices such as an image input device, a fingerprint reader, and a semiconductor memory.

REFERENCE SIGNS LIST

1 Substrate
3 Gate electrode
5 Gate insulating layer
7, 17 Semiconductor layer
71 First oxide semiconductor layer
72 Second oxide semiconductor layer
70 Intermediate oxide semiconductor layer
8 Source electrode
9 Drain electrode
13 Interlayer insulating film
101, 102 Thin film transistor (TFT)

The invention claimed is:

1. A semiconductor device comprising:
   a substrate; and
   a thin film transistor supported on the substrate,
   wherein the thin film transistor includes a semiconductor layer, a gate electrode, a gate insulating layer formed between the gate electrode and the semiconductor layer, and a source electrode and a drain electrode being in contact with the semiconductor layer,
   the semiconductor layer includes a layered structure including
   a first oxide semiconductor layer including In and Zn, in which an atomic ratio of In with respect to all metallic elements included in the first oxide semiconductor layer is higher than an atomic ratio of Zn,
   a second oxide semiconductor layer including In and Zn, in which an atomic ratio of Zn with respect to all metallic elements included in the second oxide semiconductor layer is higher than an atomic ratio of In, and
   an intermediate oxide semiconductor layer arranged between the first oxide semiconductor layer and the second oxide semiconductor layer, the first and second oxide semiconductor layers are crystalline oxide semiconductor layers,
the intermediate oxide semiconductor layer is an amorphous oxide semiconductor layer,
the first oxide semiconductor layer is arranged nearer to the gate insulating layer than the second oxide semiconductor layer, and
the first oxide semiconductor layer includes In, Sn, and Zn, and the second oxide semiconductor layer includes In, Ga, and Zn.

2. The semiconductor device according to claim 1,
wherein the intermediate oxide semiconductor layer includes In and Zn, and
an atomic ratio of Zn and an atomic ratio of In with respect to all metallic elements included in the intermediate oxide semiconductor layer are approximately identical to each other.

3. The semiconductor device according to claim 1,
wherein the intermediate oxide semiconductor layer is in contact with the first oxide semiconductor layer and the second oxide semiconductor layer.

4. The semiconductor device according to claim 1,
wherein the intermediate oxide semiconductor layer includes In, Ga, and Zn.

5. The semiconductor device according to claim 1,
wherein a thickness of the first oxide semiconductor layer is smaller than a thickness of the second oxide semiconductor layer.

6. The semiconductor device according to claim 1,
wherein an energy gap G1 of the first oxide semiconductor layer, an energy gap G2 of the second oxide semiconductor layer, and an energy gap Gm of the intermediate oxide semiconductor layer satisfy G2>Gm>G1.

7. The semiconductor device according to claim 1,
wherein the thin film transistor includes a bottom gate structure, and the first oxide semiconductor layer is in contact with an upper face of the gate insulating layer.

8. The semiconductor device according to claim 1,
wherein the thin film transistor includes a channel etched structure.

9. A semiconductor device comprising:
a substrate; and
a thin film transistor supported on the substrate,
wherein the thin film transistor includes a semiconductor layer, a gate electrode, a gate insulating layer formed between the gate electrode and the semiconductor layer, and a source electrode and a drain electrode being in contact with the semiconductor layer,
the semiconductor layer includes a layered structure including
a first oxide semiconductor layer including In and Zn, in which an atomic ratio of In with respect to all metallic elements included in the first oxide semiconductor layer is higher than an atomic ratio of Zn,
a second oxide semiconductor layer including In and Zn, in which an atomic ratio of Zn with respect to all metallic elements included in the second oxide semiconductor layer is higher than an atomic ratio of In,
an intermediate oxide semiconductor layer arranged between the first oxide semiconductor layer and the second oxide semiconductor layer, the intermediate oxide semiconductor layer including In and Zn, in which an atomic ratio of Zn and an atomic ratio of In with respect to all metallic elements included in the intermediate oxide semiconductor layer are approximately identical to each other, and the first oxide semiconductor layer is arranged nearer to the gate insulating layer than the second oxide semiconductor layer, and
the first oxide semiconductor layer includes In, Sn, and Zn, and the second oxide semiconductor layer includes In, Ga, and Zn.

10. The semiconductor device according to claim 9,
wherein the first and second oxide semiconductor layers are crystalline oxide semiconductor layers.

11. The semiconductor device according to claim 9,
wherein the intermediate oxide semiconductor layer is an amorphous oxide semiconductor layer.

12. The semiconductor device according to claim 10,
wherein the intermediate oxide semiconductor layer includes a crystallite, the crystal size of which is smaller than those of the first and second oxide semiconductor layers.

13. A manufacturing method for a semiconductor device, the method comprising:
(A) forming a gate electrode and a gate insulating layer covering the gate electrode on a substrate;
(B) forming an oxide semiconductor layered film by forming a first oxide semiconductor film including In, Sn and Zn, an intermediate oxide semiconductor film, and a second oxide semiconductor film including In, Ga, and Zn in this order, the first oxide semiconductor film and the second oxide semiconductor film being crystalline oxide semiconductor films, the intermediate oxide semiconductor film being an amorphous oxide semiconductor film, an atomic ratio of In with respect to all metallic elements included in the first oxide semiconductor film being higher than an atomic ratio of Zn, and an atomic ratio of Zn with respect to all metallic elements included in the second oxide semiconductor film being higher than an atomic ratio of In;
(C) performing heat treatment on the oxide semiconductor layered film at a temperature of 300 degrees Celsius or higher and 500 degrees Celsius or less, the amorphous oxide semiconductor film being maintained in an amorphous state;
(D) forming a semiconductor layer including a first oxide semiconductor layer, an intermediate oxide semiconductor layer, a second oxide semiconductor layer in this order on the gate insulating later by patterning the oxide semiconductor layered film after the (C), the first oxide semiconductor film and the second oxide semiconductor film being crystalline oxide semiconductor films, and the intermediate oxide semiconductor layer being an amorphous oxide semiconductor film; and
(E) forming a source electrode and a drain electrode being in contact with the semiconductor layer, thereby acquiring a thin film transistor.

* * * * *